United States Patent
Tang et al.

(10) Patent No.: US 9,805,979 B2
(45) Date of Patent: Oct. 31, 2017

(54) ELECTRONIC PACKAGE AND FABRICATION METHOD THEREOF

(71) Applicant: Siliconware Precision Industries Co., Ltd., Taichung (TW)

(72) Inventors: Shao-Tzu Tang, Taichung (TW); Chang-Yi Lan, Taichung (TW); Ying-Chou Tsai, Taichung (TW)

(73) Assignee: Siliconware Precision Industires Co., Ltd., Taichung (TW)

( * ) Notice: Subject to any disclaimer, the term of this patent is extended or adjusted under 35 U.S.C. 154(b) by 0 days.

(21) Appl. No.: 14/624,642

(22) Filed: Feb. 18, 2015

(65) Prior Publication Data
US 2016/0133593 A1 May 12, 2016

(30) Foreign Application Priority Data
Nov. 11, 2014 (TW) .............................. 103138998 A

(51) Int. Cl.
*H01L 23/28* (2006.01)
*H01L 21/78* (2006.01)
(Continued)

(52) U.S. Cl.
CPC .......... *H01L 21/78* (2013.01); *H01L 23/3114* (2013.01); *H01L 23/3157* (2013.01); *H01L 24/92* (2013.01); *H01L 24/94* (2013.01); *H01L 24/96* (2013.01); *H01L 21/561* (2013.01); *H01L 22/12* (2013.01); *H01L 24/11* (2013.01); *H01L 24/13* (2013.01); *H01L 24/16* (2013.01); *H01L 24/81* (2013.01); *H01L 2224/1148* (2013.01); *H01L 2224/1191* (2013.01); *H01L 2224/12105* (2013.01); *H01L 2224/131* (2013.01); *H01L 2224/13022* (2013.01); *H01L 2224/13024* (2013.01); *H01L 2224/16227* (2013.01);
(Continued)

(58) Field of Classification Search
CPC . H01L 2924/181; H01L 21/565; H01L 24/96; H01L 2924/18161; H01L 21/56; H01L 21/563
USPC .................................................. 257/787, 780
See application file for complete search history.

(56) References Cited

U.S. PATENT DOCUMENTS 5,450,283 A * 9/1995 Lin .................... H01L 21/563
174/16.3
6,338,980 B1 * 1/2002 Satoh ................ H01L 21/561
257/E21.508
(Continued)

*Primary Examiner* — S. V. Clark
(74) *Attorney, Agent, or Firm* — Mintz Levin Cohn Ferris Glovsky and Popeo, P.C.; Peter F. Corless; Steven M. Jensen

(57) ABSTRACT

An electronic package is provided, which includes: an electronic element having an active surface with a plurality of electrode pads, an inactive surface opposite to the active surface, and a side surface adjacent to and connecting the active and inactive surfaces; a plurality of conductive elements formed on the electrode pads of the electronic element; and an encapsulant covering the active and side surfaces of the electronic element and portions of side surfaces of the conductive elements and exposing the inactive surface of the electronic element. Therefore, the invention enhances the structural strength of the active surface of the electronic element so as to prevent cracking of the electronic element and hence avoid delamination of the conductive elements from the electronic element.

5 Claims, 4 Drawing Sheets

(51) Int. Cl.
  *H01L 23/31* (2006.01)
  *H01L 21/66* (2006.01)
  *H01L 21/56* (2006.01)
  *H01L 23/00* (2006.01)
(52) U.S. Cl.
  CPC ...... *H01L 2224/92* (2013.01); *H01L 2224/94* (2013.01); *H01L 2224/96* (2013.01); *H01L 2924/00015* (2013.01); *H01L 2924/1816* (2013.01); *H01L 2924/37001* (2013.01)

(56) References Cited

U.S. PATENT DOCUMENTS

| | | | | |
|---|---|---|---|---|
| 6,759,737 B2 * | 7/2004 | Seo | ...................... | H01L 23/3107 257/666 |
| 6,818,475 B2 * | 11/2004 | Yang | ................... | H01L 23/3114 257/E21.508 |
| 7,199,479 B2 * | 4/2007 | Wu | ...................... | H01L 21/563 257/737 |
| 7,221,059 B2 * | 5/2007 | Farnworth | .......... | H01L 21/3043 257/774 |
| 7,276,783 B2 * | 10/2007 | Goller | ..................... | H01L 21/56 257/678 |
| 7,282,702 B2 * | 10/2007 | Jeon | ........................ | H05H 3/02 250/251 |
| 7,727,875 B2 * | 6/2010 | Shin | ...................... | H01L 21/561 257/E21.503 |
| 7,880,317 B2 * | 2/2011 | Ohde | .................... | H01L 21/565 257/787 |
| 7,944,039 B2 * | 5/2011 | Arai | ...................... | H01L 21/568 257/690 |
| 8,143,097 B2 * | 3/2012 | Chi | ..................... | H01L 21/6835 257/777 |
| 2013/0328220 A1 * | 12/2013 | Lee | ..................... | H01L 23/3121 257/787 |

* cited by examiner

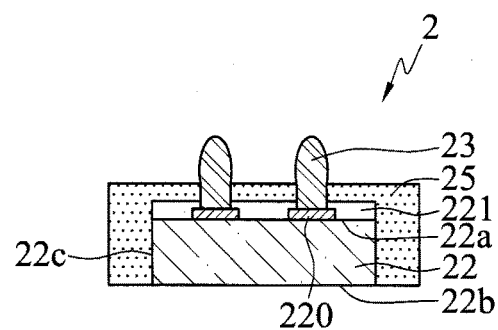
FIG. 2F
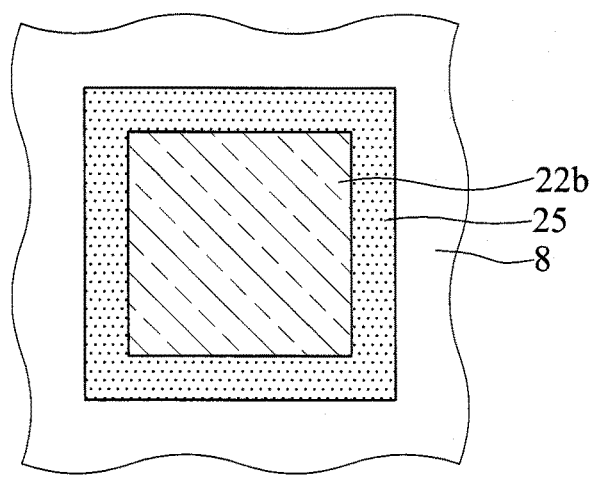
FIG. 2F'
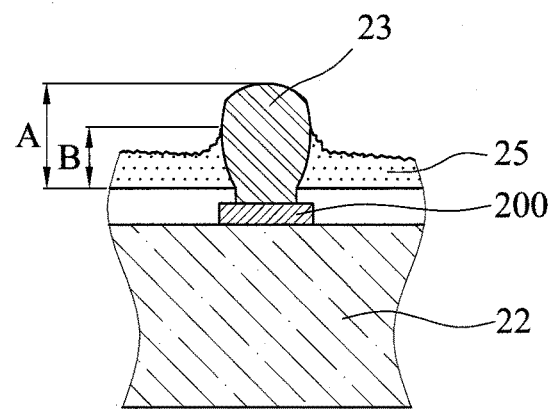
FIG. 2F"

ELECTRONIC PACKAGE AND FABRICATION METHOD THEREOF

CROSS-REFERENCES TO RELATED APPLICATIONS

This application claims under 35 U.S.C. §119(a) the benefit of Taiwanese Application No. 103138998, filed Nov. 11, 2014, the entire contents of which are incorporated herein by reference.

BACKGROUND OF THE INVENTION

1. Field of the Invention

The present invention relates to electronic packages, and more particularly, to an electronic package and a fabrication method thereof for improving the product reliability.

2. Description of Related Art

Along with the progress of electronic industries, electronic products are developed toward the trend of miniaturization and multi-function. Accordingly, various package types have been developed. To meet the demands of semiconductor devices for high integration, miniaturization and high electrical performance, wafer level chip scale packaging (WLCSP) technologies have been developed.

FIGS. 1A to 1E are schematic cross-sectional views showing a method for fabricating a WLCSP package 1 according to the prior art.

Referring to FIGS. 1A and 1B, a wafer 12' is cut into a plurality of semiconductor elements 12 and then the semiconductor elements 12 are disposed on an adhesive layer 11 of a carrier 10. Thereafter, the semiconductor elements 12 are tested. Each of the semiconductor elements 12 has an active surface 12a with a plurality of electrode pads 120, an inactive surface 12b opposite to the active surface 12a, and a side surface 12c adjacent to and connecting the active and inactive surfaces 12a, 12b. The semiconductor element 12 is disposed on the adhesive layer 11 via the active surface 12a thereof.

Referring to FIG. 1C, an encapsulant 13 is formed on the adhesive layer 11 to encapsulate the semiconductor elements 12.

Referring to FIG. 1D, the carrier 10 and the adhesive layer 11 are removed to expose the active surfaces 12a of the semiconductor elements 12.

Referring to FIG. 1E, an RDL (redistribution layer) process is performed to form an RDL structure 14 on the encapsulant 13 and the active surfaces 12a of the semiconductor elements 12. The RDL structure 14 is electrically connected to the electrode pads 120 of the semiconductor elements 12.

Then, an insulating layer 15 is formed on the RDL structure 14. Portions of the RDL structure 14 are exposed from the insulating layer 15 and a plurality of conductive elements 16 such as solder bumps are mounted on the exposed portions of the RDL structure 14.

Thereafter, a singulation process is performed along a cutting path S of FIG. 1E to form a plurality of packages 1.

However, since the active surfaces 12a of the semiconductor elements 12 have a quite low structural strength, cracking easily occurs to the semiconductor elements 12 during the processes of FIGS. 1A and 1B and consequently the conductive elements 16 easily delaminate from the semiconductor elements 12. Further, such a cracking cannot be detected since a test process is generally performed before separation of the semiconductor elements 12. As such, when the package 1 is picked up and placed at a suitable position and subjected to an SMT (surface mount technology) process, the above-described drawbacks easily result in a reduced product yield.

Therefore, how to overcome the above-described drawbacks has become critical.

SUMMARY OF THE INVENTION

In view of the above-described drawbacks, the present invention provides an electronic package, which comprises: an electronic element having an active surface with a plurality of electrode pads, an inactive surface opposite to the active surface, and a side surface adjacent to and connecting the active and inactive surfaces; a plurality of conductive elements formed on the electrode pads of the electronic element; and an encapsulant covering the active and side surfaces of the electronic element and portions of side surfaces of the conductive elements and exposing the inactive surface of the electronic element.

The present invention further provides a method for fabricating an electronic package, which comprises the steps of: providing a substrate having a plurality of electronic elements and a plurality of separation portions formed between the electronic elements, wherein each of the electronic elements has an active surface with a plurality of electrode pads and an inactive surface opposite to the active surface; forming openings in the separation portions from a side corresponding to the active surfaces of the electronic elements, wherein the openings do not penetrate the substrate; forming an encapsulant in the openings and on the active surfaces of the electronic elements, wherein the electrode pads of the electronic elements are exposed from the encapsulant; and singulating the electronic elements along the separation portions from another side corresponding to the inactive surfaces of the electronic elements, with the encapsulant covering the active and side surfaces of each of the electronic elements, wherein the side surface of each of the electronic elements is adjacent to and connecting the active and inactive surfaces of the electronic element.

In an embodiment, the singulation path along the separation portions is less in width than the separation portions.

In an embodiment, the encapsulant is not formed on the inactive surfaces of the electronic elements.

After forming the encapsulant and before singulating the electronic elements, the method can further comprise testing the substrate.

Before singulating the electronic elements, the method can further comprise thinning the electronic elements from the inactive surfaces thereof.

In the above-described package and method, a surface of the encapsulant can be flush with the inactive surface of the electronic element.

In the above-described package and method, the encapsulant can be made of an insulating material.

The above-described method can further comprise forming a plurality of conductive elements on the electrode pads of the electronic elements. The encapsulant can further cover portions of side surfaces of the conductive elements. Portions of the encapsulant that extend on the side surfaces of the conductive elements can have a height in a range of 0.01 to 0.9 mm.

In an embodiment, the step of forming the encapsulant can be performed before forming the conductive elements.

In an embodiment, the method further comprises forming a soft insulating layer to cover the conductive elements; and removing the soft insulating layer after forming the encapsulant.

In the above-described package and method, the electronic element can be an active element, a passive element or a combination thereof.

In an embodiment, after singulating the electronic elements, the method further comprises bonding each of the electronic elements to an electronic device via the active surface thereof.

Therefore, by forming openings in the separation portions first and then forming an encapsulant in the openings and on the active surfaces of the electronic elements, the present invention allows the active and side surfaces of the electronic elements to be covered with the encapsulant so as to enhance the structural strength of the electronic elements and prevent cracking of the electronic elements during a singulation process.

Further, before the singulation process, the present invention can test the substrate to determine whether any cracking has occurred in the substrate during formation of the openings and identify defective electronic elements. As such, after the singulation process, defective electronic packages can be removed, thereby improving the product yield during a SMT process.

BRIEF DESCRIPTION OF DRAWINGS

FIGS. 2A to 2F are schematic cross-sectional views showing a method for fabricating an electronic package according to the present invention; and FIGS. 2A', 2C' and 2F'' show another embodiment of FIGS. 2A, 2C and 2F, respectively, and FIG. 2F' is a schematic lower view of the electronic package of FIG. 2F that is disposed on a circuit board.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "on", "a" etc. are merely for illustrative purposes and should not be construed to limit the scope of the present invention.

FIGS. 2A to 2F are schematic cross-sectional views showing a method for fabricating an electronic package 2 according to the present invention.

Figure 1A:
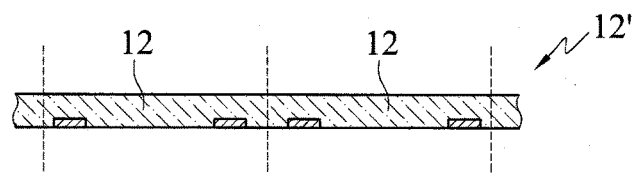
FIGS. 1A to 1E are schematic cross-sectional views showing a method for fabricating a WLCSP package according to the prior art.
Figure 1B:
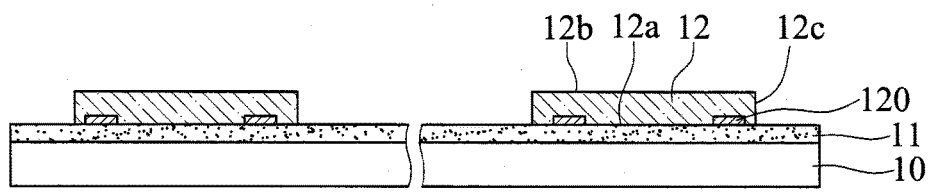
Figure 1C:
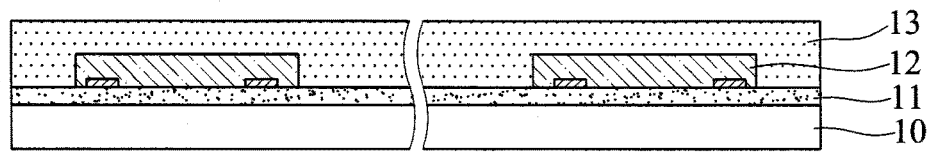
Figure 1D:
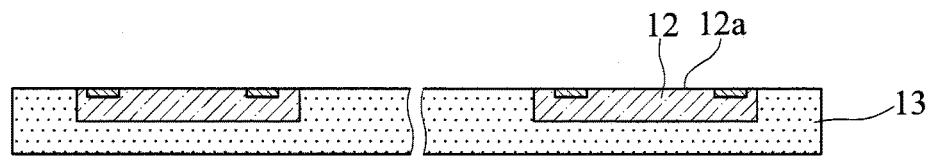
Figure 1E:
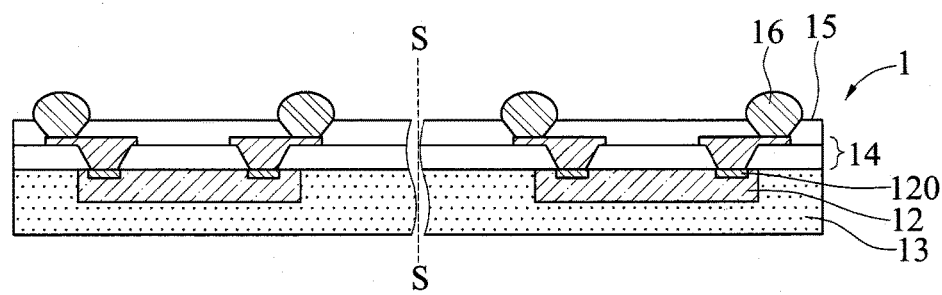
Figure 2A:
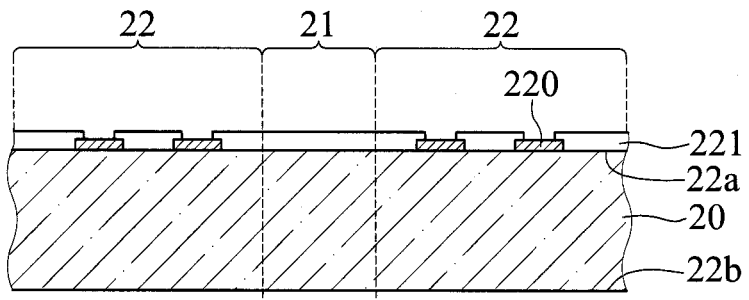
Figure 2A:
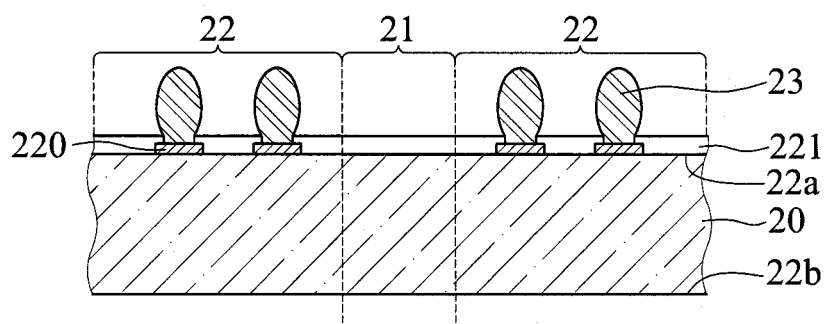

Referring to FIG. 2A, a full-panel substrate 20 is provided, which has a plurality of electronic elements 22 and a plurality of separation portions 21 formed between the electronic elements 22.

In the present embodiment, each of the electronic elements 22 has an active surface 22a with a plurality of electrode pads 220 and an inactive surface 22b opposite to the active surface 22a. Further, an insulating layer 221 is formed on the active surfaces 22a of the electronic elements 22 and exposing the electrode pads 220 of the electronic elements 22.

Each of the electronic elements 22 is an active element such as a semiconductor chip, a passive element such as a resistor, a capacitor or an inductor, or a combination thereof.

In the present embodiment, the full-panel substrate 20 is a silicon wafer, and the electronic elements 22 are active elements.

In addition, an RDL process is already performed on the electronic elements 22 and the outermost RDL layer includes the electrode pads 220.

Figure 2B:
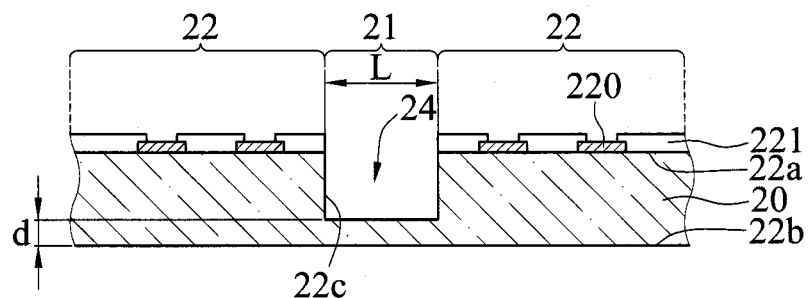

Referring to FIG. 2B, a laser cutting process is performed from a side of the separation portions 21 corresponding to the active surfaces 22a of the electronic elements 22 so as to form an opening 24 in each of the separation portions 21. As such, each of the electronic elements 22 has a side surface 22c adjacent to and connecting the active and inactive surfaces 22a, 22b. The opening 24 does not penetrate through the corresponding separate portion 21.

In the present embodiment, each of the separation portions 21 is partially removed and the remaining portion has a thickness d of 20 um. The width L of the opening 24, i.e, the width of the separation portion 21, is in a range of 10 um to 3 mm.

Figure 2C:
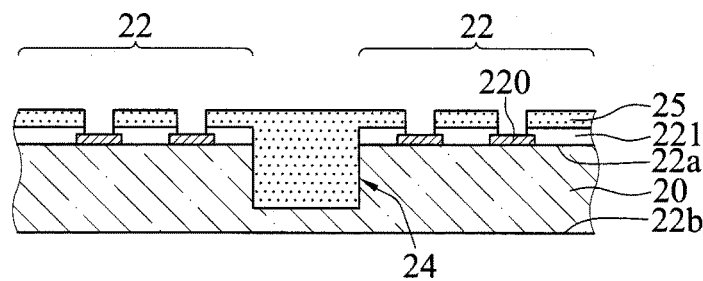
Figure 2C:
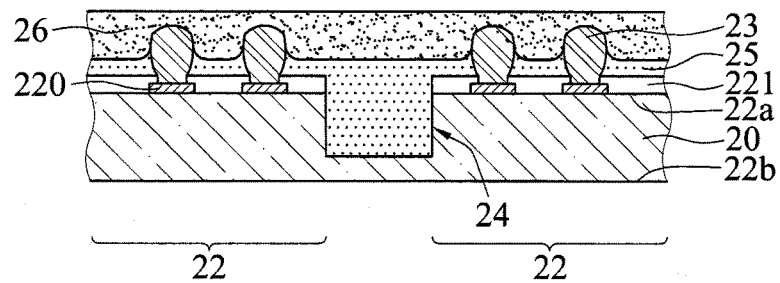

Referring to FIG. 2C, an encapsulant 25 is formed in the openings 24 and on the insulating layer 221 and exposing the electrode pads 220. Then, the full-panel substrate 20 is tested to determine whether any cracking has occurred in the substrate 20 during formation of the openings 24.

In the present embodiment, the encapsulant 25 is filled in the openings 24 and formed around the electronic elements 22. The encapsulant 25 is made of an insulating material, for example, a molding compound material, a dry film material, a photoresist material or a solder mask material.

In the present embodiment, the encapsulant 25 is not formed on the inactive surfaces 22b of the electronic elements 22.

Figure 2D:
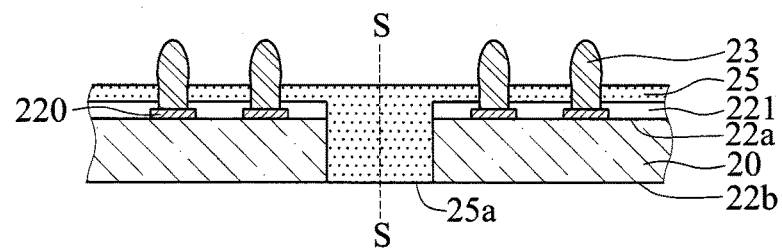

Referring to FIG. 2D, a thinning process such as grinding is performed on the inactive surfaces 22b of the electronic elements 22 so as to expose the encapsulant 25 in the openings 24. As such, the encapsulant 25 has a surface 25a flush with the inactive surfaces 22b of the electronic elements 22.

Then, a plurality of conductive elements 23 are formed on the electrode pads 220 of the electronic elements 22, and the encapsulant 25 further covers portions of side surfaces of the conductive elements 23.

In the present embodiment, the conductive elements 23 are solder balls, metal bumps or a combination thereof.

Figure 2E:
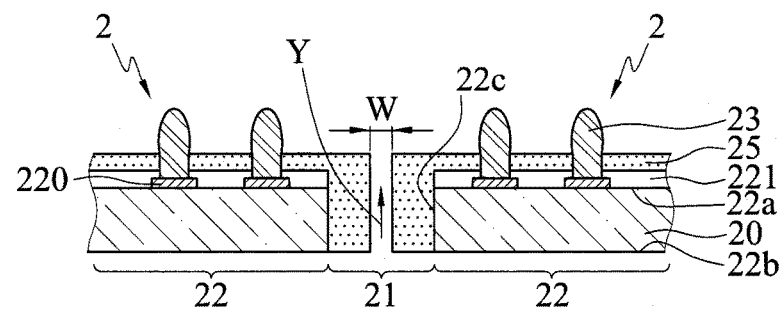

Referring to FIG. 2E, a singulation process is performed along the separation portions from another side corresponding to the inactive surfaces 22b of the electronic elements 22, i.e., along a cutting path S of FIG. 2D in a direction Y of FIG. 2E, so as to separate the electronic elements 22 from one another. As such, a plurality of electronic packages 2 are formed.

In the present embodiment, the singulation process is performed by cutting the encapsulant 25 with a diamond cutter, and the width W of the cutting path S is less than the width L of the openings 24 (as shown in FIG. 2B).

Referring to FIGS. 2F and 2F', each of the electronic elements 22 is flip-chip bonded to an electronic device such as a circuit board 8, with the conductive elements 23 being electrically connected to conductive pads (not shown) of the circuit board 8.

In another embodiment, referring to FIG. 2A', before formation of the openings 24, the conductive elements 23 are formed on the electrode pads 220 of the electronic elements 22. Then, referring to FIG. 2C', a soft insulating layer 26 is formed to cover the conductive elements 23. Thereafter, the encapsulant 25 is formed. The electrode pads 220 and the conductive elements 23 are exposed from the encapsulant 25. The encapsulant 25 can be formed on the active surfaces 22a of the electronic elements 22 by molding or spin coating. Finally, referring to FIG. 2F''', the soft insulating layer 26 is removed, and the encapsulant 25 further covers portions of side surfaces of the conductive elements 23. The height B of the portions of the encapsulant 25 that extend on the side surfaces of the conductive elements 23 is 0.05 to 0.9 of the height A of the conductive elements 23. That is, B=0.05 A to 0.9 A. The height B of the portions of the encapsulant 25 that extend on the side surfaces of the conductive elements 23 is in a range of 0.01 to 0.9 mm. In practice, the conductive elements 23 generally have a height of about 1 mm, which may slightly vary according to the type of the conductive elements 23. To make the height B of the encapsulant to be 0.05 to 0.9 of the height A of the conductive elements 23, the encapsulant is preferably formed by spin coating. Referring to FIG. 2F''', the encapsulant 25 close to the conductive elements 23 has an uneven surface due to the characteristic of the soft insulating layer 26.

Therefore, by forming the openings 24 in the separation portions 21 first and then forming the encapsulant 25 in the openings 24 and on the active surfaces 22a of the electronic elements 22, the present invention allows the active and side surfaces 22a, 22c of the electronic elements 22 to be covered with the encapsulant 25 so as to enhance the structural strength of the electronic packages 2. As such, during the singulation process, the active surfaces 22a of the electronic elements 22 do not crack due to their high structural strength. Hence, the present invention avoids delamination of the conductive elements 23 from the electronic elements 22, and improves the product yield when the electronic packages 2 are subsequently subjected to a SMT process or transported.

Further, before the singulation process, the present invention can test the full-panel substrate 20 to identify defective electronic elements 22. As such, after the singulation process, defective electronic packages 2 can be removed. Therefore, the present invention improves the product yield during a SMT process.

In addition, in the embodiment of FIG. 2C', the conductive elements 23 are formed before formation of the encapsulant 25. As such, after the encapsulant 25 is formed, the conductive elements 23 can be protected by the encapsulant 25, thereby strengthening the bonding stability of the conductive elements 23 and preventing delamination of the conductive elements 23 from the electronic elements 22.

The present invention further provides an electronic package 2, which has: an electronic element 22 having an active surface 22a with a plurality of electrode pads 220, an inactive surface 22b opposite to the active surface 22a, and a side surface 22c adjacent to and connecting the active and inactive surfaces 22a, 22b; a plurality of conductive elements 23 formed on the electrode pads 220 of the electronic element 22; and an encapsulant 25 covering the active and side surfaces 22a, 22c of the electronic element 22 and portions of side surfaces of the conductive element 23 and exposing the inactive surface 22b of the electronic element 22.

The electronic element 22 can be an active element, a passive element or a combination thereof.

The encapsulant 25 can be made of an insulating material.

Portions of the encapsulant 25 that extend on the side surfaces of the conductive elements 23 can have a height B in a range of 0.01 to 0.9 mm.

In an embodiment, a surface of the encapsulant 25 is flush with the inactive surface 23b of the electronic element 23.

In an embodiment, the electronic element 22 is bonded to a circuit board 8 via the active surface 22a thereof.

According to the present invention, the configuration of the encapsulant facilitates to enhance the structural strength of the electronic packages so as to prevent cracking of the electronic elements and improve the product yield.

Further, by performing a test on the full-panel substrate before the singulation process, the present invention improves the product yield during a SMT process.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electronic package, comprising:
    an electronic element having an active surface with a plurality of electrode pads, an inactive surface opposite to the active surface, and a side surface adjacent to and connecting the active and inactive surfaces;
    a plurality of conductive elements formed on the electrode pads of the electronic element, wherein each of the plurality of conductive elements has a height of about 1 mm; and
    an encapsulant covering the active and side surfaces of the electronic element and exposing the inactive surface of the electronic element,
    wherein portions of the encapsulant that extend on lateral side surfaces of the conductive elements have a height in a range of 0.01 to 0.9 mm.

2. The package of claim 1, wherein the electronic element is an active element, a passive element or a combination thereof.

3. The package of claim 1, wherein the electronic element is bonded to an electronic device via the active surface thereof.

4. The package of claim 1, wherein a surface of the encapsulant is flush with the inactive surface of the electronic element.

5. The package of claim 1, wherein the encapsulant is made of an insulating material.

* * * * *